United States Patent
O'Loughlin et al.

(10) Patent No.: US 10,541,306 B2
(45) Date of Patent: Jan. 21, 2020

(54) USING A CARBON VACANCY REDUCTION MATERIAL TO INCREASE AVERAGE CARRIER LIFETIME IN A SILICON CARBIDE SEMICONDUCTOR DEVICE

(75) Inventors: Michael John O'Loughlin, Chapel Hill, NC (US); Lin Cheng, Chapel Hill, NC (US); Albert Augustus Burk, Jr., Chapel Hill, NC (US); Anant Kumar Agarwal, Chapel Hill, NC (US); Alexander Suvorov, Durham, NC (US)

(73) Assignee: Cree, Inc., Durham, NC (US)

( * ) Notice: Subject to any disclaimer, the term of this patent is extended or adjusted under 35 U.S.C. 154(b) by 387 days.

(21) Appl. No.: 13/610,993

(22) Filed: Sep. 12, 2012

(65) Prior Publication Data

US 2014/0070230 A1   Mar. 13, 2014

(51) Int. Cl.
| | | |
|---|---|---|
| *H01L 29/16* | (2006.01) | |
| *H01L 21/02* | (2006.01) | |
| *H01L 21/322* | (2006.01) | |
| *H01L 21/265* | (2006.01) | |

(52) U.S. Cl.
CPC .... *H01L 29/1608* (2013.01); *H01L 21/02664* (2013.01); *H01L 21/322* (2013.01); *H01L 21/26506* (2013.01); *H01L 21/26513* (2013.01)

(58) Field of Classification Search
CPC ............... H01L 29/1608; H01L 21/322; H01L 21/02664; H01L 21/26513; H01L 21/26506
USPC ................................................... 257/77, 607
See application file for complete search history.

(56) References Cited

U.S. PATENT DOCUMENTS

| | | | | |
|---|---|---|---|---|
| 6,734,462 | B1* | 5/2004 | Shah ..................... | H01L 29/744 257/107 |
| 2006/0130742 | A1* | 6/2006 | Carter, Jr. ............... | C30B 29/36 117/84 |
| 2008/0197360 | A1* | 8/2008 | Sriram ................ | H01L 29/0657 257/77 |
| 2009/0039358 | A1* | 2/2009 | Tsuchida et al. ................ | 257/77 |
| 2010/0308337 | A1* | 12/2010 | Sriram .................. | H01L 29/872 257/73 |
| 2013/0234159 | A1* | 9/2013 | Tsuchiya ......................... | 257/77 |

OTHER PUBLICATIONS

Enhanced annealing of the Z1/2 defect in 4H-SiC epilayers, Liutauras Storasta et al. Journal of Applied Physics 103, 013705 (2008).*

(Continued)

*Primary Examiner* — Mohammed R Alam
(74) *Attorney, Agent, or Firm* — Withrow & Terranova, P.L.L.C.

(57) ABSTRACT

A semiconductor die and a process for fabricating the semiconductor die are disclosed. The semiconductor die has a substrate and a silicon carbide (SiC) epitaxial structure on the substrate. The SiC epitaxial structure includes at least a first N-type SiC layer, at least a first P-type SiC layer, and carbon vacancy reduction material, which has been implanted into a surface of the SiC epitaxial structure. Further, the SiC epitaxial structure has been annealed to mobilize the carbon vacancy reduction material to diffuse carbon atoms substantially throughout the SiC epitaxial structure, thereby increasing an average carrier lifetime in the SiC epitaxial structure.

31 Claims, 11 Drawing Sheets

(56) References Cited

OTHER PUBLICATIONS

Reduction of Deep Levels and Improvement of Carrier Lifetime in n-Type 4H-SiC by Thermal Oxidation, Toru Hiyoshi et al. Applied Physics Express 2 (2009) 041101.*
Carbon-vacancy related defects in 4H- and 6H-SiC, N.T. Son et al. Materials Science and Engineering B61-62 (1999) 202-206.*
Hiyoshi, et al., "Elimination of the major deep levels in n- and p-type 4H-SiC by two-step thermal treatment," Applied Physics Express, vol. 2, Sep. 4, 2009, 3 pages.
Miyazawa et al., "Evaluation of long carrier lifetimes in thick 4H silicon carbide epitaxial layers," Applied Physics Letters, vol. 97, Nov. 2010, 3 pages.
Booker et al., "Comparison of post-growth carrier lifetime improvement methods for 4H-SiC Epilayers," Materials Science Forum, vol. 717-720, May 2012, pp. 285-288.
Kawahara, Koutarou et al., "Deep Levels Generated by Thermal Oxidation in P-Type 4H-SiC," Journal of Applied Physics, vol. 113, No. 3, Jan. 21, 2013, 9 pages.
Miyazawa, Tetsuya et al., "Growth of 4H-SiC Epilayers and Z 1/2 Center Elimination," Materials Sceince Forum, vol. 717-720, May 1, 2012, pp. 81-86.
Storasta, L. et al., "Enhanced Annealing of the Main Lifetime Limiting Defect in Thick 4H-SiC Layers," Materials Science Forum, vols. 600-603, Jan. 1, 2009, pp. 477-481.
Storasta, Liutauras et al., "Enhanced Annealing of the Z 1/2 Defects in 4H-SiC Epilayers," Journal of Applied Physics, vol. 103, No. 1, Jan. 14, 2008, 7 pages.
Storasta, Liutauras et al., "Reduction of Traps and Improvement of Carrier Lifetime in 4H-SiC Epilayers by Ion Implantation," Applied Physics Letters, vol. 90, No. 6, Feb. 8, 2007, 3 pages.
International Search Report for PCT/US2013/058252, dated Jan. 20, 2014, 12 pages.
International Preliminary Report on Patentability for PCT/US2013/058252, dated Mar. 26, 2015, 8 pages.

* cited by examiner

USING A CARBON VACANCY REDUCTION MATERIAL TO INCREASE AVERAGE CARRIER LIFETIME IN A SILICON CARBIDE SEMICONDUCTOR DEVICE

This invention was made with government funds under Contract No.DE-AR-0000110 awarded by the Advanced Research Projects Agency-Energy(ARPA-E). The U.S. Government has certain rights in this invention.

FIELD OF THE DISCLOSURE

The present disclosure relates to silicon carbide (SiC) semiconductor devices, such as SiC bipolar junction transistor (BJT)s, SiC insulated gate junction devices, SiC P-type intrinsic N-type (PIN) diodes, the like, or any combination thereof.

BACKGROUND

SiC has relatively high thermal conductivity, high electric field breakdown strength, high maximum current density, and a high sublimation point. As a result, SiC is often used as a semiconductor material in applications requiring high speed, high temperature, high voltage, high current, high power, the like, or any combination thereof. However, performance of high voltage, high current SiC semiconductor devices, such as SiC PIN diodes, SiC BJTs, and SiC insulated gate junction devices, may be limited by a relatively low carrier lifetime of N-type and P-type epitaxial layers in the high voltage, high current SiC semiconductor devices. The low carrier lifetime may result in a high ON state resistance of a SiC semiconductor device, thereby causing a relatively high voltage drop across the SiC semiconductor device, which causes a relatively high conduction power loss of the SiC semiconductor device. Epitaxial growth techniques used to increase carrier lifetimes, such as lower temperature growth or a lower silicon-to-carbon ratio, typically result in higher defect densities in the epitaxial layers, thereby making high voltage, high current SiC semiconductor devices impractical. As such, there is a need for a high voltage, high current SiC semiconductor device having a relatively high carrier lifetime of N-type and P-type epitaxial layers in the high voltage, high current SiC semiconductor device.

SUMMARY

The present disclosure relates to a semiconductor die and a process for fabricating the semiconductor die. The semiconductor die has a substrate and a silicon carbide (SiC) epitaxial structure on the substrate. The SiC epitaxial structure includes at least a first N-type SiC layer, at least a first P-type SiC layer, and carbon vacancy reduction material, which has been implanted into a surface of the SiC epitaxial structure. Further, the SiC epitaxial structure has been annealed to mobilize the carbon vacancy reduction material to diffuse carbon atoms substantially throughout the SiC epitaxial structure, thereby increasing an average carrier lifetime in the SiC epitaxial structure.

In one embodiment of the semiconductor die, diffusing the carbon atoms substantially throughout the SiC epitaxial structure at least partially fills carbon vacancies in a crystalline lattice of the SiC epitaxial structure, thereby increasing the average carrier lifetime in the SiC epitaxial structure. In this regard, the SiC epitaxial structure includes multiple native carbon atoms in the crystalline lattice of the silicon carbide epitaxial structure and multiple carbon vacancy reduction material provided carbon atoms in the crystalline lattice of the silicon carbide epitaxial structure. In one embodiment of the semiconductor die, the carbon vacancy reduction material is substantially removed from the SiC epitaxial structure after the SiC epitaxial structure has been annealed. The carbon vacancy reduction material may include one or more elements selected from Group III, Group V, and Group VIII of a Periodic Table of the Elements. Additionally or alternatively, the carbon vacancy reduction material may include hydrogen.

Those skilled in the art will appreciate the scope of the disclosure and realize additional aspects thereof after reading the following detailed description in association with the accompanying drawings.

BRIEF DESCRIPTION OF THE DRAWINGS

The accompanying drawings incorporated in and forming a part of this specification illustrate several aspects of the disclosure, and together with the description serve to explain the principles of the disclosure.

DETAILED DESCRIPTION

Figure 1:
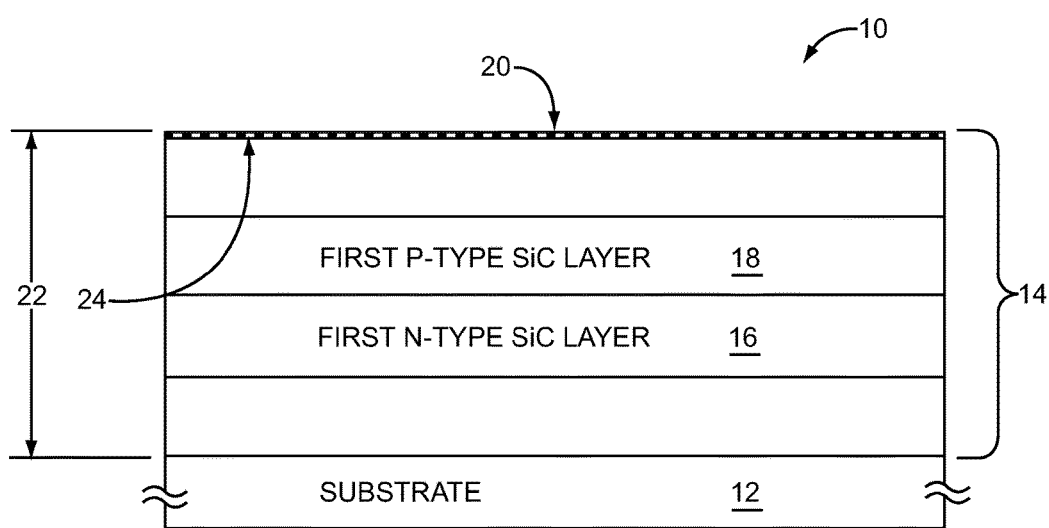
FIG. 1 illustrates a cross-section of a semiconductor die according to one embodiment of the present disclosure.

The embodiments set forth below represent the necessary information to enable those skilled in the art to practice the disclosure and illustrate the best mode of practicing the disclosure. Upon reading the following description in light of the accompanying drawings, those skilled in the art will understand the concepts of the disclosure and will recognize applications of these concepts not particularly addressed herein. It should be understood that these concepts and applications fall within the scope of the disclosure and the accompanying claims.

It will be understood that when an element such as a layer, region, or substrate is referred to as being "over," "on," "in," or extending "onto" another element, it can be directly over, directly on, directly in, or extend directly onto the other element or intervening elements may also be present. In contrast, when an element is referred to as being "directly over," "directly on," "directly in," or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" may be used herein to describe a relationship of one element, layer, or region to another element, layer, or region as illustrated in the Figures. It will be understood that these terms and those discussed above are intended to encompass different orientations of the device in addition to the orientation depicted in the Figures.

The present disclosure relates to a semiconductor die and a process for fabricating the semiconductor die. The semiconductor die has a substrate and a silicon carbide (SiC) epitaxial structure on the substrate. The SiC epitaxial structure includes at least a first N-type SiC layer, at least a first P-type SiC layer, and carbon vacancy reduction material, which has been implanted into a surface of the SiC epitaxial structure. Further, the SiC epitaxial structure has been annealed to mobilize the carbon vacancy reduction material to diffuse carbon atoms substantially throughout the SiC epitaxial structure, thereby increasing an average carrier lifetime in the SiC epitaxial structure.

In one embodiment of the semiconductor die, diffusing the carbon atoms substantially throughout the SiC epitaxial structure at least partially fills carbon vacancies in a crystalline lattice of the SiC epitaxial structure, thereby increasing the average carrier lifetime in the SiC epitaxial structure. In this regard, the SiC epitaxial structure includes multiple native carbon atoms in the crystalline lattice of the silicon carbide epitaxial structure and multiple carbon vacancy reduction material provided carbon atoms in the crystalline lattice of the silicon carbide epitaxial structure. In one embodiment of the semiconductor die, the carbon vacancy reduction material is substantially removed from the SiC epitaxial structure after the SiC epitaxial structure has been annealed. The carbon vacancy reduction material may include one or more elements selected from Group III, Group V, and Group VIII of a Periodic Table of the Elements. Additionally or alternatively, the carbon vacancy reduction material may include hydrogen.

Implanting the carbon vacancy reduction material into the surface of the SiC epitaxial structure may cause damage to the crystalline lattice of the SiC epitaxial structure. However, annealing the SiC epitaxial structure may re-crystallize at least part of the damage to the crystalline lattice and may create excess carbon atoms, which may cause carbon atoms to be diffused substantially throughout the SiC epitaxial structure, thereby at least partially filling lifetime limiting carbon vacancies. In this regard, after annealing, in one embodiment of the SiC epitaxial structure, the carbon vacancy reduction material is substantially removed from the SiC epitaxial structure. In an alternate embodiment of the SiC epitaxial structure, the carbon vacancy reduction material is not removed from the SiC epitaxial structure.

In one embodiment of the present disclosure, the SiC epitaxial structure includes at least one SiC power device, such as a SiC PIN diode, a SiC BJT, a SiC insulated gate junction device, a SiC thyristor, the like, or any combination thereof. The SiC power device may have requirements for high speed, high temperature, high voltage, high current, high power, the like, or any combination thereof. Further, in one embodiment of the present disclosure, the SiC power device utilizes bipolar conduction, in which both "holes" and "electrons" are used as charge carriers.

FIG. 1 illustrates a cross-section of a semiconductor die 10 according to one embodiment of the present disclosure. The semiconductor die 10 includes a substrate 12 and a SiC epitaxial structure 14 on the substrate 12. The SiC epitaxial structure 14 includes at least a first N-type SiC layer 16 and at least a first P-type SiC layer 18. The SiC epitaxial structure 14 has a surface 20 and a structure thickness 22. Further, the SiC epitaxial structure 14 includes carbon vacancy reduction material 24, which has been implanted into the surface 20. Additionally, the SiC epitaxial structure 14 has been annealed to mobilize the carbon vacancy reduction material 24 to diffuse carbon atoms substantially throughout the SiC epitaxial structure 14, thereby increasing an average carrier lifetime in the SiC epitaxial structure 14. Diffusing the carbon atoms substantially throughout the SiC epitaxial structure 14 may at least partially fill carbon vacancies in a crystalline lattice of the SiC epitaxial structure 14.

In one embodiment of the SiC epitaxial structure 14, the structure thickness 22 is equal to at least 100 micrometers. In an alternate embodiment of the SiC epitaxial structure 14, the structure thickness 22 is equal to at least 150 micrometers. In an additional embodiment of the SiC epitaxial structure 14, the structure thickness 22 is equal to at least 200 micrometers. In one embodiment of the substrate 12, the substrate 12 includes SiC.

The carbon vacancy reduction material 24 may function to reduce carbon vacancies in the crystalline lattice of the SiC epitaxial structure 14 by at least partially filling carbon vacancies in the crystalline lattice of the SiC epitaxial structure 14. A number of different materials may be suitable as the carbon vacancy reduction material 24. Group III of a Periodic Table of the Elements includes boron, aluminum, gallium, indium, and thallium. Group V of the Periodic Table of the Elements includes nitrogen, phosphorus, arsenic, antimony, and bismuth. Group VIII of the Periodic Table of the Elements includes helium, neon, argon, krypton, xenon, and radon.

In one embodiment of the carbon vacancy reduction material 24, the carbon vacancy reduction material 24 includes at least one element selected from any or all of Group III, Group V, and Group VIII of the Periodic Table of the Elements. In an alternate embodiment of the carbon vacancy reduction material 24, the carbon vacancy reduction material 24 includes at least one element selected from Group III of the Periodic Table of the Elements. In an additional embodiment of the carbon vacancy reduction material 24, the carbon vacancy reduction material 24 includes at least one element selected from Group V of the Periodic Table of the Elements. In another embodiment of the carbon vacancy reduction material 24, the carbon vacancy reduction material 24 includes at least one element selected from Group VIII of the Periodic Table of the Elements.

In a first exemplary embodiment of the carbon vacancy reduction material 24, the carbon vacancy reduction material 24 includes aluminum. In a second exemplary embodiment of the carbon vacancy reduction material 24, the carbon vacancy reduction material 24 includes nitrogen. In a third exemplary embodiment of the carbon vacancy reduction material 24, the carbon vacancy reduction material 24 includes phosphorus. In a fourth exemplary embodiment of the carbon vacancy reduction material 24, the carbon vacancy reduction material 24 includes helium. In a fifth exemplary embodiment of the carbon vacancy reduction material 24, the carbon vacancy reduction material 24 includes argon. In a sixth exemplary embodiment of the carbon vacancy reduction material 24, the carbon vacancy reduction material 24 includes hydrogen.

In a seventh exemplary embodiment of the carbon vacancy reduction material 24, the carbon vacancy reduction material 24 includes arsenic. In an eighth exemplary embodiment of the carbon vacancy reduction material 24, the carbon vacancy reduction material 24 includes antimony. In a ninth exemplary embodiment of the carbon vacancy reduction material 24, the carbon vacancy reduction material 24 includes bismuth. In a tenth exemplary embodiment of the carbon vacancy reduction material 24, the carbon vacancy reduction material 24 includes boron. In a eleventh exemplary embodiment of the carbon vacancy reduction material 24, the carbon vacancy reduction material 24 includes gallium. In a twelfth exemplary embodiment of the carbon vacancy reduction material 24, the carbon vacancy reduction material 24 includes indium.

In a thirteenth exemplary embodiment of the carbon vacancy reduction material 24, the carbon vacancy reduction material 24 includes thallium. In a fourteenth exemplary embodiment of the carbon vacancy reduction material 24, the carbon vacancy reduction material 24 includes neon. In a fifteenth exemplary embodiment of the carbon vacancy reduction material 24, the carbon vacancy reduction material 24 includes krypton. In a sixteenth exemplary embodiment of the carbon vacancy reduction material 24, the carbon vacancy reduction material 24 includes xenon. In a seventeenth exemplary embodiment of the carbon vacancy reduction material 24, the carbon vacancy reduction material 24 includes radon. In one embodiment of the carbon vacancy reduction material 24, the carbon vacancy reduction material 24 does not include carbon.

Alternate embodiments of the semiconductor die 10 illustrated in FIG. 1 may further include at least one insulating layer (not shown), at least one conducting layer (not shown), at least one additional semiconductor layer (not shown), the like, or any combination thereof.

Figure 2:
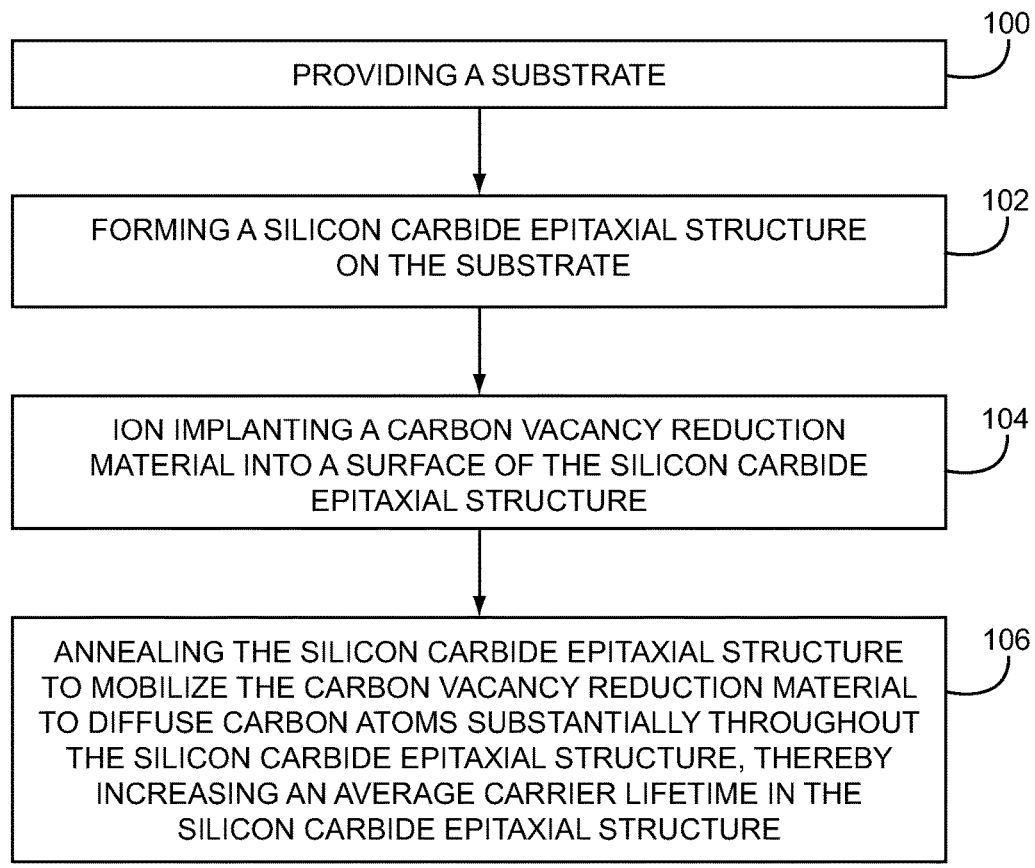
FIG. 2 illustrates a process for fabricating the semiconductor die illustrated in FIG. 1 according to one embodiment of the present disclosure.

FIG. 2 illustrates a process for fabricating the semiconductor die 10 illustrated in FIG. 1 according to one embodiment of the present disclosure. The process for fabricating the semiconductor die 10 begins by providing the substrate 12 (Step 100). The process continues by forming the SiC epitaxial structure 14 on the substrate 12 (Step 102). As previously presented, the SiC epitaxial structure 14 includes the first N-type SiC layer 16 and the first P-type SiC layer 18. The process continues by ion implanting the carbon vacancy reduction material 24 into the surface 20 of the SiC epitaxial structure 14 (Step 104). The process concludes by annealing the SiC epitaxial structure 14 to mobilize the carbon vacancy reduction material 24 to diffuse carbon atoms substantially throughout the SiC epitaxial structure 14, thereby increasing an average carrier lifetime in the SiC epitaxial structure 14 (Step 106).

In one embodiment of the process illustrated in FIG. 2, an average carrier lifetime in the SiC epitaxial structure 14 after annealing the SiC epitaxial structure 14 is at least three times an average carrier lifetime in the SiC epitaxial structure 14 before ion implanting the carbon vacancy reduction material 24. In an alternate embodiment of the process illustrated in FIG. 2, the average carrier lifetime in the SiC epitaxial structure 14 after annealing the SiC epitaxial structure 14 is at least ten times the average carrier lifetime in the SiC epitaxial structure 14 before ion implanting the carbon vacancy reduction material 24. In an additional embodiment of the process illustrated in FIG. 2, the average carrier lifetime in the SiC epitaxial structure 14 after annealing the SiC epitaxial structure 14 is at least twenty times the average carrier lifetime in the SiC epitaxial structure 14 before ion implanting the carbon vacancy reduction material 24. In another embodiment of the process illustrated in FIG. 2, the average carrier lifetime in the SiC epitaxial structure 14 after annealing the SiC epitaxial structure 14 is at least fifty times the average carrier lifetime in the SiC epitaxial structure 14 before ion implanting the carbon vacancy reduction material 24.

In one embodiment of the process illustrated in FIG. 2, during the annealing the SiC epitaxial structure 14, a temperature of the SiC epitaxial structure 14 is between about 1500 and about 1800 degrees Celsius for a duration of greater than twenty minutes. In an alternate embodiment of the process illustrated in FIG. 2, during the annealing the SiC epitaxial structure 14, a temperature of the SiC epitaxial structure 14 is between about 1500 and about 1800 degrees Celsius for a duration of between twenty minutes and forty minutes. In an additional embodiment of the process illustrated in FIG. 2, during the annealing the SiC epitaxial structure 14, a temperature of the SiC epitaxial structure 14 is between about 1500 and about 1800 degrees Celsius for a duration of between twenty minutes and two hours. In another embodiment of the process illustrated in FIG. 2, during the annealing the SiC epitaxial structure 14, a temperature of the SiC epitaxial structure 14 is between about 1500 and about 1800 degrees Celsius for a duration of between twenty minutes and five hours. In a further embodiment of the process illustrated in FIG. 2, during the annealing the SiC epitaxial structure 14, a temperature of the SiC epitaxial structure 14 is between about 1500 and about 1800 degrees Celsius for a duration of between twenty minutes and ten hours.

In one embodiment of the process illustrated in FIG. 2, during the annealing the SiC epitaxial structure 14, a temperature of the SiC epitaxial structure 14 is between about 1500 and about 1600 degrees Celsius for a duration of greater than twenty minutes. In an alternate embodiment of the process illustrated in FIG. 2, during the annealing the SiC epitaxial structure 14, a temperature of the SiC epitaxial structure 14 is between about 1500 and about 1600 degrees Celsius for a duration of between twenty minutes and forty minutes. In an additional embodiment of the process illustrated in FIG. 2, during the annealing the SiC epitaxial structure 14, a temperature of the SiC epitaxial structure 14 is between about 1500 and about 1600 degrees Celsius for a duration of between twenty minutes and two hours. In another embodiment of the process illustrated in FIG. 2, during the annealing the SiC epitaxial structure 14, a temperature of the SiC epitaxial structure 14 is between about 1500 and about 1600 degrees Celsius for a duration of between twenty minutes and five hours. In a further embodiment of the process illustrated in FIG. 2, during the annealing the SiC epitaxial structure 14, a temperature of the SiC epitaxial structure 14 is between about 1500 and 1600 degrees Celsius for a duration of between twenty minutes and ten hours.

In one embodiment of the process illustrated in FIG. 2, during the annealing the SiC epitaxial structure 14, a temperature of the SiC epitaxial structure 14 is between about 1650 and about 1800 degrees Celsius for a duration of greater than twenty minutes. In an alternate embodiment of the process illustrated in FIG. 2, during the annealing the SiC epitaxial structure 14, a temperature of the SiC epitaxial structure 14 is between about 1650 and about 1800 degrees Celsius for a duration of between twenty minutes and forty minutes. In an additional embodiment of the process illustrated in FIG. 2, during the annealing the SiC epitaxial structure 14, a temperature of the SiC epitaxial structure 14 is between about 1650 and about 1800 degrees Celsius for a duration of between twenty minutes and two hours. In another embodiment of the process illustrated in FIG. 2, during the annealing the SiC epitaxial structure 14, a temperature of the SiC epitaxial structure 14 is between about 1650 and about 1800 degrees Celsius for a duration of between twenty minutes and five hours. In a further embodiment of the process illustrated in FIG. 2, during the annealing the SiC epitaxial structure 14, a temperature of the SiC epitaxial structure 14 is between about 1650 and about 1800 degrees Celsius for a duration of between twenty minutes and ten hours.

In one embodiment of the process illustrated in FIG. 2, during the annealing the SiC epitaxial structure 14, a temperature of the SiC epitaxial structure 14 is greater than about 1500 degrees Celsius. In an alternate embodiment of the process illustrated in FIG. 2, during the annealing the SiC epitaxial structure 14, a temperature of the SiC epitaxial structure 14 is less than about 1800 degrees Celsius. In an additional embodiment of the process illustrated in FIG. 2, during the annealing the SiC epitaxial structure 14, a temperature of the SiC epitaxial structure 14 is between about 1550 degrees and about 1750 degrees Celsius. In an additional embodiment of the process illustrated in FIG. 2, during the annealing the SiC epitaxial structure 14, a temperature of the SiC epitaxial structure 14 is between about 1600 degrees and about 1700 degrees Celsius.

Figure 3:
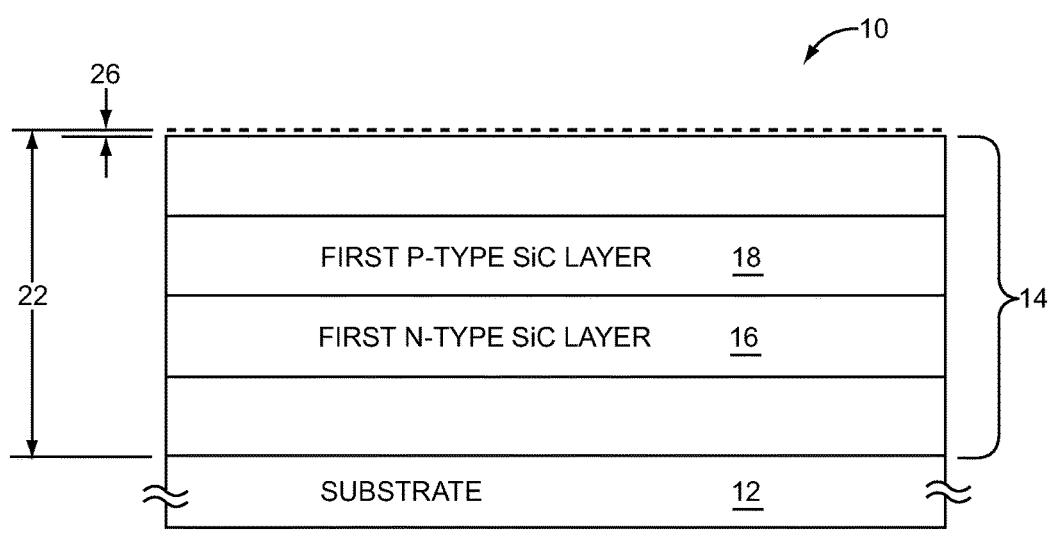
FIG. 3 illustrates the cross-section of the semiconductor die according to one embodiment of the present disclosure.

FIG. 3 illustrates a cross-section of the semiconductor die 10 according to one embodiment of the present disclosure. The semiconductor die 10 illustrated in FIG. 3 is similar to the semiconductor die 10 illustrated in FIG. 1, except in the semiconductor die 10 illustrated in FIG. 3, a substantial amount of the carbon vacancy reduction material 24 has been removed by removing the surface 20 of the SiC epitaxial structure 14. FIG. 3 shows a thickness 26 of removed material. In one embodiment of the SiC epitaxial structure 14, the thickness 26 of removed material is less than about one micrometer. In an alternate embodiment of the SiC epitaxial structure 14, the thickness 26 of removed material is less than about two micrometers. In an additional embodiment of the SiC epitaxial structure 14, the thickness 26 of removed material is less than about three micrometers. In another embodiment of the SiC epitaxial structure 14, the thickness 26 of removed material is less than about six micrometers. In a further embodiment of the SiC epitaxial structure 14, the thickness 26 of removed material is less than about ten micrometers.

Figure 4:
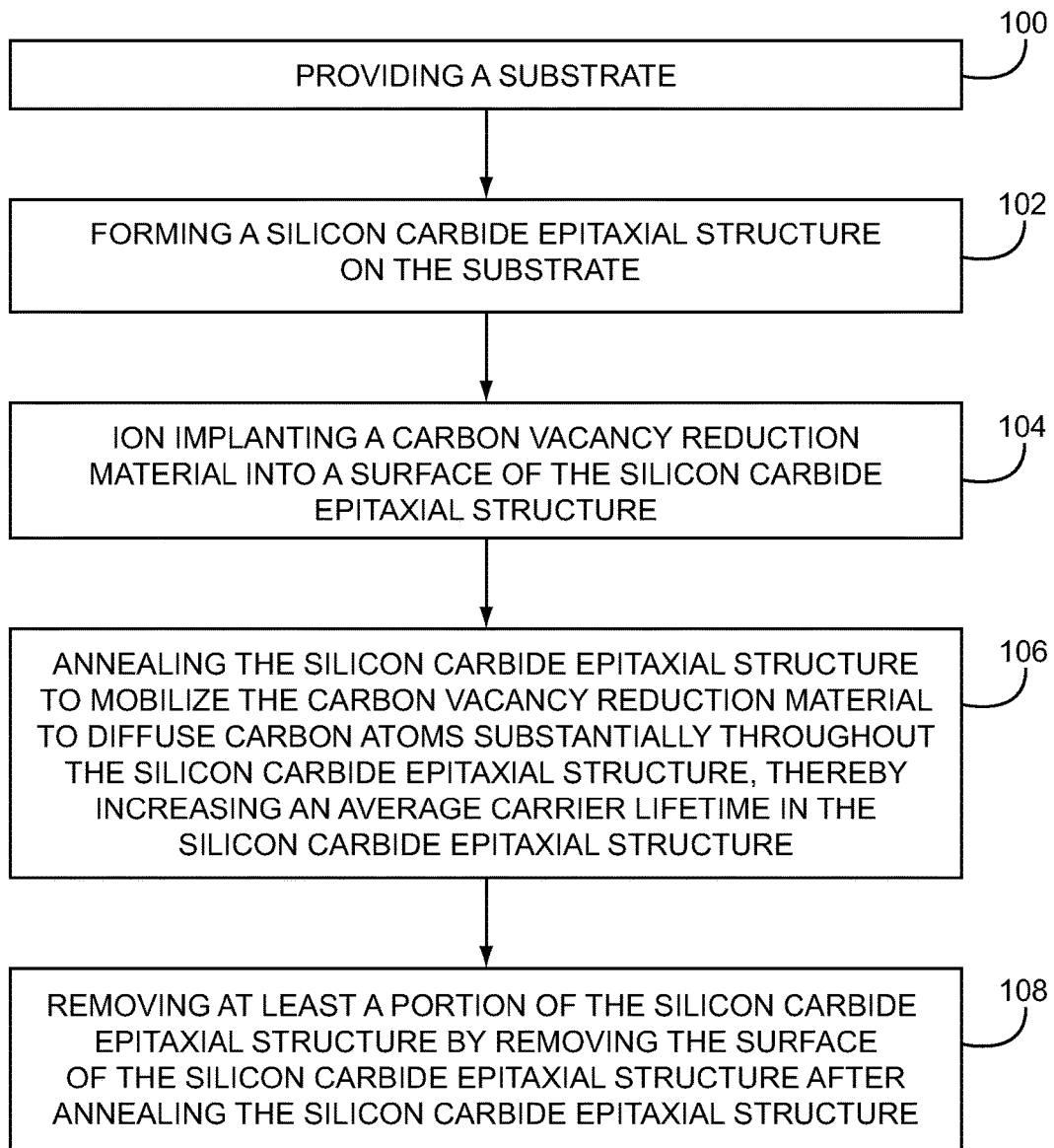
FIG. 4 illustrates a process for fabricating the semiconductor die illustrated in FIG. 3 according to one embodiment of the present disclosure.

FIG. 4 illustrates a process for fabricating the semiconductor die 10 illustrated in FIG. 3 according to one embodiment of the present disclosure. The process illustrated in FIG. 4 is similar to the process illustrated in FIG. 2, except the process illustrated in FIG. 4 further includes a process step to substantially remove the carbon vacancy reduction material 24 after annealing the SiC epitaxial structure 14 by removing the surface 20 of the SiC epitaxial structure 14.

The process for fabricating the semiconductor die 10 begins by providing the substrate 12 (Step 100). The process continues by forming the SiC epitaxial structure 14 on the substrate 12 (Step 102). As previously presented, the SiC epitaxial structure 14 includes the first N-type SiC layer 16 and the first P-type SiC layer 18. The process continues by ion implanting the carbon vacancy reduction material 24 into the surface 20 of the SiC epitaxial structure 14 (Step 104). The process continues by annealing the SiC epitaxial structure 14 to mobilize the carbon vacancy reduction material 24 to diffuse carbon atoms substantially throughout the SiC epitaxial structure 14, thereby increasing an average carrier lifetime in the SiC epitaxial structure 14 (Step 106). The process concludes by removing at least a portion of the SiC epitaxial structure 14 from the SiC epitaxial structure 14 by removing the surface 20 of the SiC epitaxial structure 14 after annealing the SiC epitaxial structure 14 (Step 108). As such, the carbon vacancy reduction material 24 may be removed from the SiC epitaxial structure 14 by removing the surface 20 of the SiC epitaxial structure 14 after annealing the SiC epitaxial structure 14.

In one embodiment of the process illustrated in FIG. 4, reactive ion etching is used to substantially remove the carbon vacancy reduction material 24 from the SiC epitaxial structure 14. In an alternate embodiment of the process illustrated in FIG. 4, polishing the surface 20 of the SiC epitaxial structure 14 is used to substantially remove the carbon vacancy reduction material 24 from the SiC epitaxial structure 14. In an additional embodiment of the process illustrated in FIG. 4, hydrogen is used to etch off the surface 20 of the SiC epitaxial structure 14, thereby substantially removing the carbon vacancy reduction material 24 from the SiC epitaxial structure 14. In another embodiment of the process illustrated in FIG. 4, thermal oxidation of the surface 20 of the SiC epitaxial structure 14 is used to substantially remove the carbon vacancy reduction material 24 from the SiC epitaxial structure 14. In one embodiment of the process illustrated in FIG. 4, Step 108 is omitted, such that the carbon vacancy reduction material 24 is not subsequently removed from the SiC epitaxial structure 14.

In one embodiment of the process illustrated in FIG. 4, a carrier concentration of the carbon vacancy reduction material 24 in the SiC epitaxial structure 14 after substantially removing the carbon vacancy reduction material 24 from the SiC epitaxial structure 14 is less than about 10 percent of a carrier concentration of any dopant material in the SiC epitaxial structure 14. In an alternate embodiment of the process illustrated in FIG. 4, a carrier concentration of the carbon vacancy reduction material 24 in the SiC epitaxial structure 14 after substantially removing the carbon vacancy reduction material 24 from the SiC epitaxial structure 14 is less than about one percent of a carrier concentration of any dopant material in the SiC epitaxial structure 14.

Figure 5:
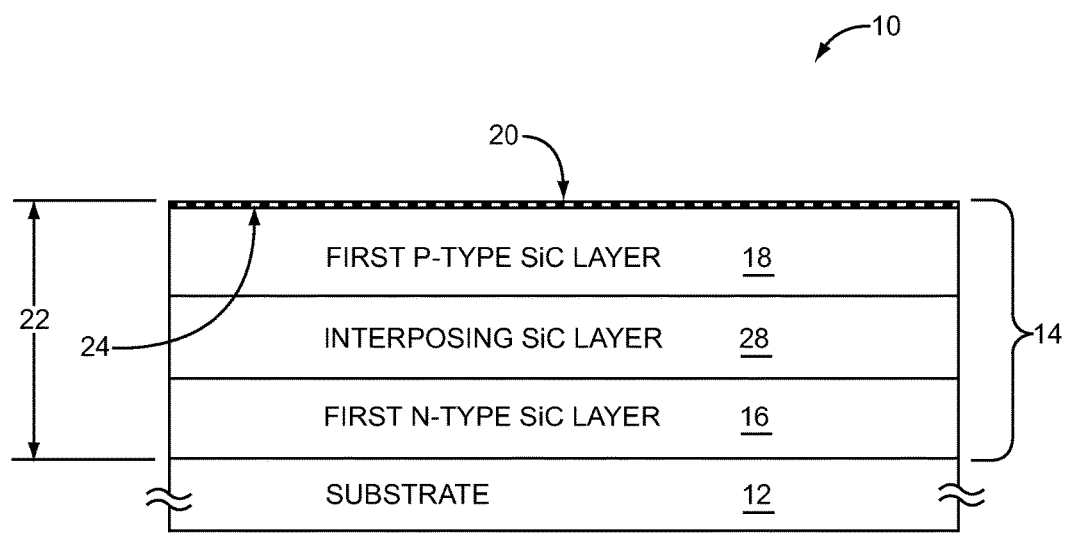
FIG. 5 illustrates a cross-section of the semiconductor die according to one embodiment of the semiconductor die.

FIG. 5 illustrates a cross-section of the semiconductor die 10 according to one embodiment of the semiconductor die 10. The semiconductor die 10 illustrated in FIG. 5 is similar to the semiconductor die 10 illustrated in FIG. 1, except the semiconductor die 10 illustrated in FIG. 5 further includes an Interposing SiC layer 28, such that the first N-type SiC layer 16 is on the substrate 12, the Interposing SiC layer 28 is on the first N-type SiC layer 16, and the first P-type SiC layer 18 is on the Interposing SiC layer 28. As such, the first N-type SiC layer 16, the first P-type SiC layer 18, and the Interposing SiC layer 28 may be used to provide a SiC PIN diode.

In one embodiment of the Interposing SiC layer 28, the Interposing SiC layer 28 includes intrinsic material. In an alternate embodiment of the Interposing SiC layer 28, the Interposing SiC layer 28 includes lightly doped semiconductor material. Alternate embodiments of the semiconductor die 10 illustrated in FIG. 5 may further include at least one insulating layer (not shown), at least one conducting layer (not shown), at least one additional semiconductor layer (not shown), the like, or any combination thereof.

Figure 6:
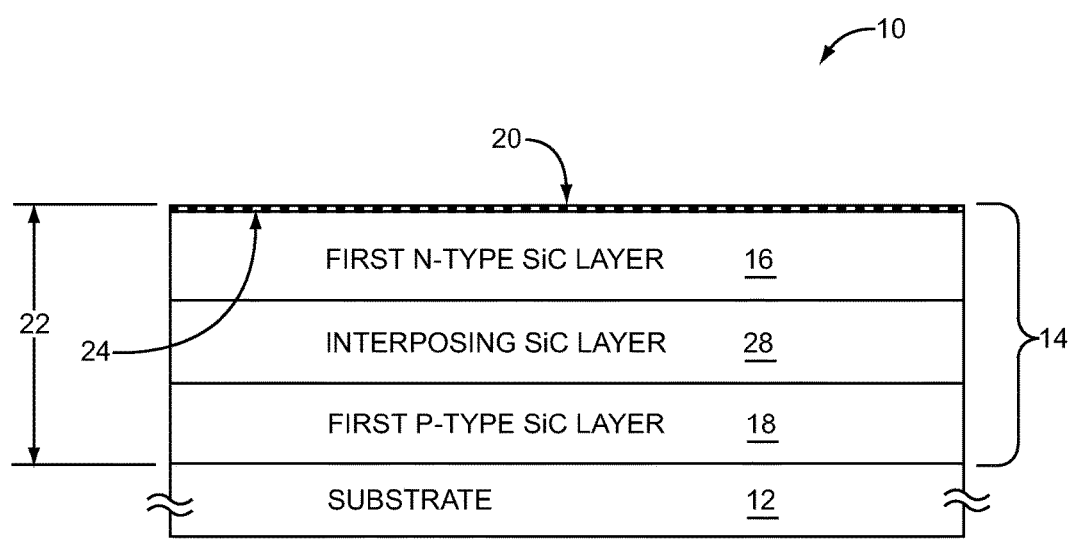
FIG. 6 illustrates a cross-section of the semiconductor die according to an alternate embodiment of the semiconductor die.

FIG. 6 illustrates a cross-section of the semiconductor die 10 according to an alternate embodiment of the semiconductor die 10. The semiconductor die 10 illustrated in FIG. 6 is similar to the semiconductor die 10 illustrated in FIG. 1, except the semiconductor die 10 illustrated in FIG. 6 further includes the Interposing SiC layer 28, such that the first P-type SiC layer 18 is on the substrate 12, the Interposing SiC layer 28 is on the first P-type SiC layer 18, and the first N-type SiC layer 16 is on the Interposing SiC layer 28. As such, the first N-type SiC layer 16, the first P-type SiC layer 18, and the Interposing SiC layer 28 may be used to provide a SiC PIN diode.

In one embodiment of the Interposing SiC layer 28, the Interposing SiC layer 28 includes intrinsic material. In an alternate embodiment of the Interposing SiC layer 28, the Interposing SiC layer 28 includes lightly doped semiconductor material. Alternate embodiments of the semiconductor die 10 illustrated in FIG. 6 may further include at least one insulating layer (not shown), at least one conducting layer (not shown), at least one additional semiconductor layer (not shown), the like, or any combination thereof.

Figure 7:
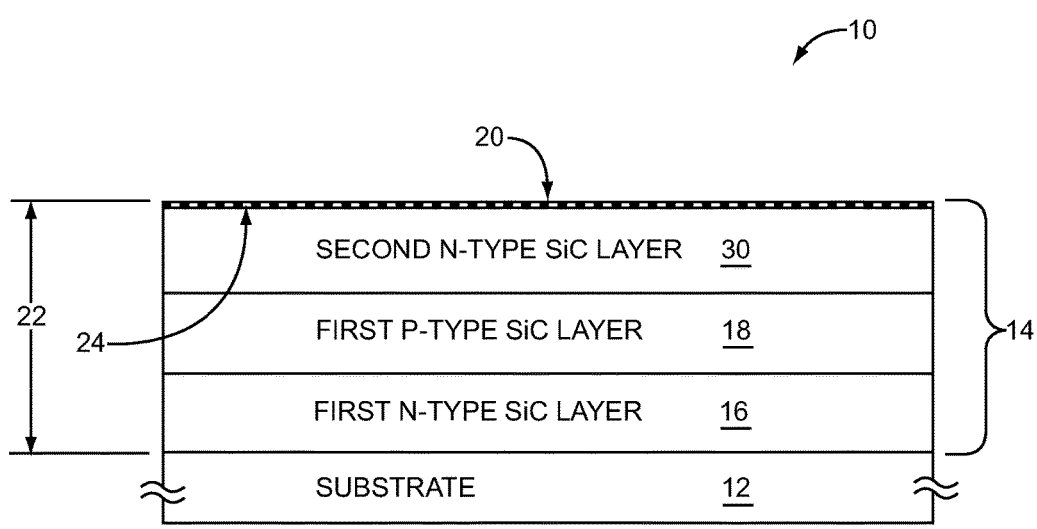
FIG. 7 illustrates a cross-section of the semiconductor die according to an additional embodiment of the semiconductor die.

FIG. 7 illustrates a cross-section of the semiconductor die 10 according to an additional embodiment of the semiconductor die 10. The semiconductor die 10 illustrated in FIG. 7 is similar to the semiconductor die 10 illustrated in FIG. 1, except the semiconductor die 10 illustrated in FIG. 7 further includes a second N-type SiC layer 30, such that the first N-type SiC layer 16 is on the substrate 12, the first P-type SiC layer 18 is on the first N-type SiC layer 16, and the second N-type SiC layer 30 is on the first P-type SiC layer 18.

As such, in one embodiment of the semiconductor die 10, the first N-type SiC layer 16, the first P-type SiC layer 18, and the second N-type SiC layer 30 are used to form an NPN SiC BJT. In an alternate embodiment of the semiconductor die 10, the first N-type SiC layer 16, the first P-type SiC layer 18, and the second N-type SiC layer 30 are used to form a SiC insulated gate junction device. Alternate embodiments of the semiconductor die 10 illustrated in FIG. 7 may further include at least one insulating layer (not shown), at least one conducting layer (not shown), at least one additional semiconductor layer (not shown), the like, or any combination thereof.

Figure 8:
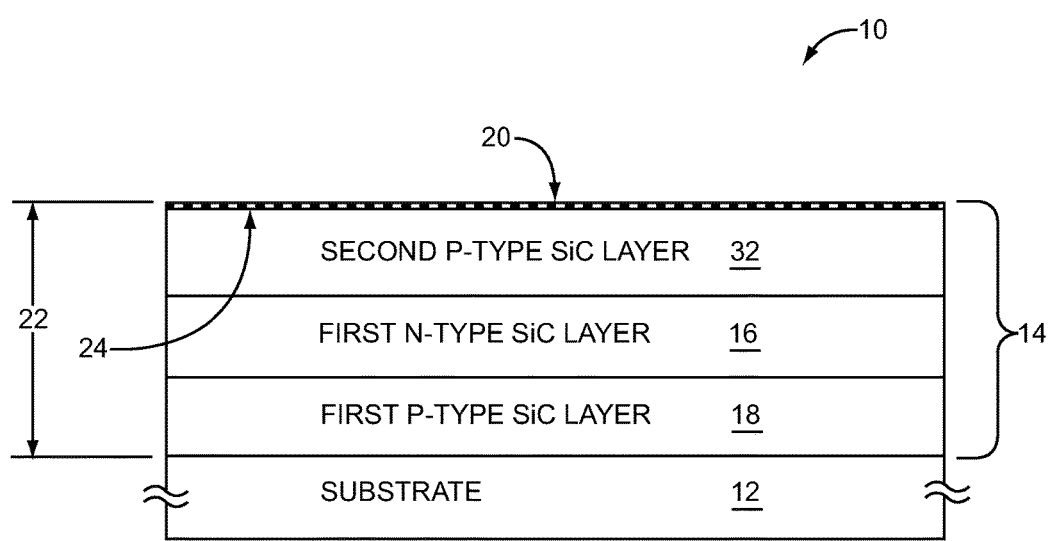
FIG. 8 illustrates a cross-section of the semiconductor die according to another embodiment of the semiconductor die.

FIG. 8 illustrates a cross-section of the semiconductor die 10 according to another embodiment of the semiconductor die 10. The semiconductor die 10 illustrated in FIG. 8 is similar to the semiconductor die 10 illustrated in FIG. 1, except the semiconductor die 10 illustrated in FIG. 8 further includes a second P-type SiC layer 32, such that the first P-type SiC layer 18 is on the substrate 12, the first N-type SiC layer 16 is on the first P-type SiC layer 18, and the second P-type SiC layer 32 is on the first N-type SiC layer 16.

As such, in one embodiment of the semiconductor die 10, the first N-type SiC layer 16, the first P-type SiC layer 18, and the second P-type SiC layer 32 are used to form a PNP SiC BJT. In an alternate embodiment of the semiconductor die 10, the first N-type SiC layer 16, the first P-type SiC layer 18, and the second P-type SiC layer 32 are used to form a SiC insulated gate junction device. Alternate embodiments of the semiconductor die 10 illustrated in FIG. 8 may further include at least one insulating layer (not shown), at least one conducting layer (not shown), at least one additional semiconductor layer (not shown), the like, or any combination thereof.

Figure 9:
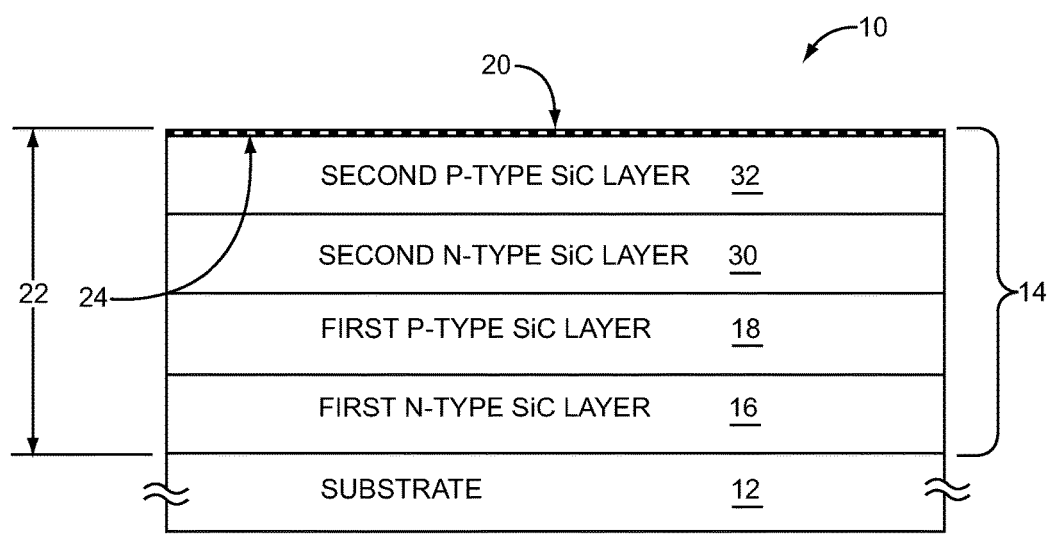
FIG. 9 illustrates a cross-section of the semiconductor die according to a further embodiment of the semiconductor die.

FIG. 9 illustrates a cross-section of the semiconductor die 10 according to a further embodiment of the semiconductor die 10. The semiconductor die 10 illustrated in FIG. 9 is similar to the semiconductor die 10 illustrated in FIG. 7, except the semiconductor die 10 illustrated in FIG. 9 further includes the second P-type SiC layer 32, which is on the second N-type SiC layer 30. As such, in one embodiment of the semiconductor die 10, the first N-type SiC layer 16, the first P-type SiC layer 18, the second N-type SiC layer 30, and the second P-type SiC layer 32 are used to form a SiC thyristor.

The SiC thyristor may include an anode gate thyristor (AGT), a Si controlled rectifier (SCR), an asymmetrical SCR, a bidirectional control thyristor (BCT), a breakover diode (BOD), a gate turn-off thyristor (GTO), MOS controlled thyristor, a distributed buffer—GTO, an integrated gate commutated thyristor (IGCT), a light activated SCR (LASCR), a light activated semiconducting switch (LASS), a base resistance controlled thyristor (BRT), a reverse conducting thyristor (RCT), a programmable unijunction transistor (PUT), a triode for alternating current (TRIAC), or the like. Alternate embodiments of the semiconductor die 10 illustrated in FIG. 9 may further include at least one insulating layer (not shown), at least one conducting layer (not shown), at least one additional semiconductor layer (not shown), the like, or any combination thereof.

Figure 10:
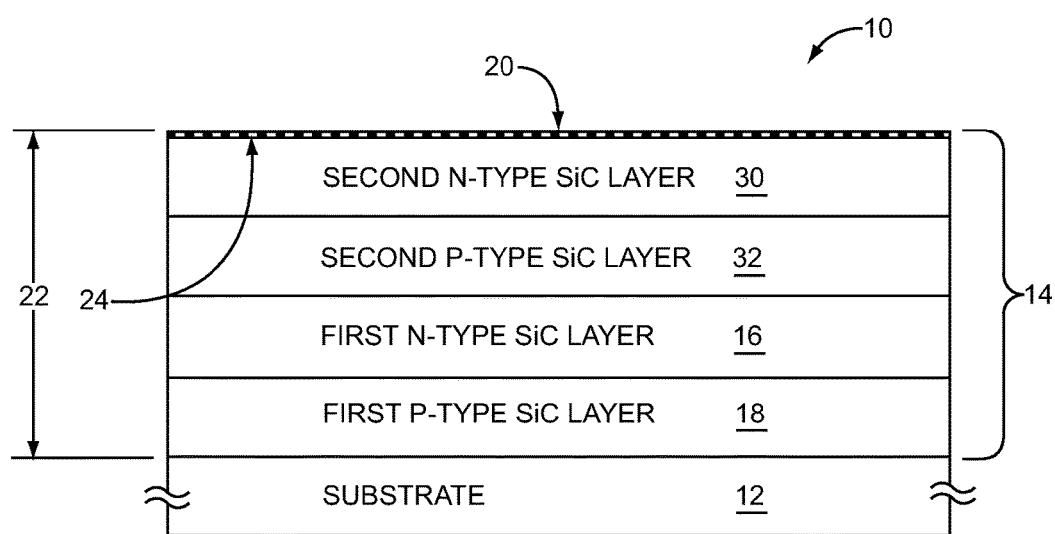
FIG. 10 illustrates a cross-section of the semiconductor die according to a supplemental embodiment of the semiconductor die.

FIG. 10 illustrates a cross-section of the semiconductor die 10 according to a supplemental embodiment of the semiconductor die 10. The semiconductor die 10 illustrated in FIG. 10 is similar to the semiconductor die 10 illustrated in FIG. 8, except the semiconductor die 10 illustrated in FIG. 10 further includes the second N-type SiC layer 30, which is on the second P-type SiC layer 32.

As such, in one embodiment of the semiconductor die 10, the first N-type SiC layer 16, the first P-type SiC layer 18, the second N-type SiC layer 30, and the second P-type SiC layer 32 are used to form the SiC thyristor. Alternate embodiments of the semiconductor die 10 illustrated in FIG. 10 may further include at least one insulating layer (not shown), at least one conducting layer (not shown), at least one additional semiconductor layer (not shown), the like, or any combination thereof.

Figure 11:
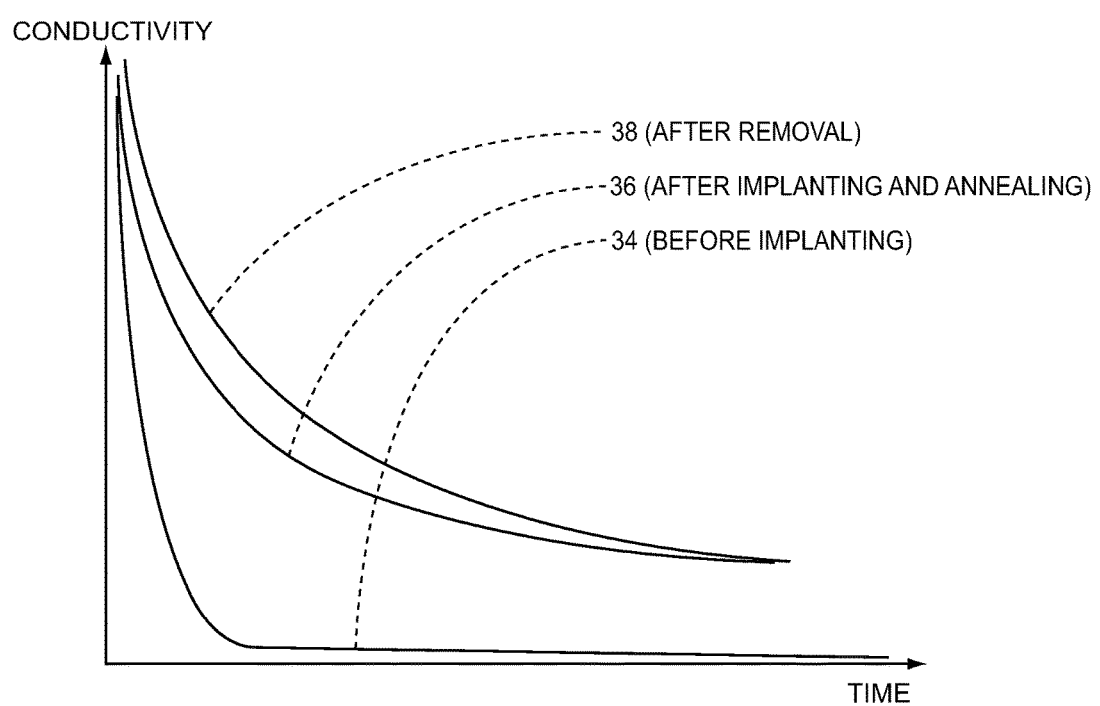
FIG. 11 is a graph illustrating conductivity decay curves of the semiconductor die illustrated in FIG. 3 at different steps in the process illustrated in FIG. 4 according to an exemplary embodiment of the semiconductor die.

FIG. 11 is a graph illustrating conductivity decay curves of the semiconductor die 10 illustrated in FIG. 3 at different steps in the process illustrated in FIG. 4. Figure shows a first conductivity decay curve 34, a second conductivity decay curve 36, and a third conductivity decay curve 38. Each of the conductivity decay curves 34, 36, 38 is representative of an average carrier lifetime in the silicon carbide epitaxial structure 14 (FIG. 3) at different steps in the process illustrated in FIG. 4. The conductivity decay curves may be determined by measuring conductivity of the SiC epitaxial structure 14 or by measuring photo-luminescence of the SiC epitaxial structure 14.

The first conductivity decay curve 34 is associated with the SiC epitaxial structure 14 after forming the SiC epitaxial structure 14 on the substrate 12 (Step 102) and before ion implanting the carbon vacancy reduction material 24 into the surface 20 of the SiC epitaxial structure 14 (Step 104). The second conductivity decay curve 36 is associated with the SiC epitaxial structure 14 after annealing the SiC epitaxial structure 14 (Step 106) and before removing the carbon vacancy reduction material 24 from the SiC epitaxial structure 14 (Step 108). The third conductivity decay curve 38 is associated with the SiC epitaxial structure 14 after removing the carbon vacancy reduction material 24 from the SiC epitaxial structure 14 (Step 108).

The first conductivity decay curve 34 shows a rapid decay in conductivity, which is indicative of a short average carrier lifetime in the silicon carbide epitaxial structure 14. The second conductivity decay curve 36 shows a significantly slower decay in conductivity than the decay shown by the first conductivity decay curve 34. Therefore, the second conductivity decay curve 36 is indicative of a significantly longer average carrier lifetime in the silicon carbide epitaxial structure 14 after ion implanting the carbon vacancy reduction material 24 (Step 104) and annealing the SiC epitaxial structure 14 (Step 106). The third conductivity decay curve 38 shows somewhat slower decay in conductivity than the decay shown by the second conductivity decay curve 36. Therefore, the average carrier lifetime in the silicon carbide epitaxial structure 14 may be somewhat further lengthened by removing the carbon vacancy reduction material 24 from the SiC epitaxial structure 14 (Step 108).

In a first exemplary embodiment of the SiC epitaxial structure 14, an average carrier lifetime of the SiC epitaxial structure 14 after forming the SiC epitaxial structure 14 on the substrate 12 (Step 102) and before ion implanting the carbon vacancy reduction material 24 into the surface 20 of the SiC epitaxial structure 14 (Step 104) is on the order of about three microseconds. In a second exemplary embodiment of the SiC epitaxial structure 14, an average carrier lifetime of the SiC epitaxial structure 14 after annealing the SiC epitaxial structure 14 (Step 106) is greater than about 10 microseconds. In a third exemplary embodiment of the SiC epitaxial structure 14, an average carrier lifetime of the SiC epitaxial structure 14 after annealing the SiC epitaxial structure 14 (Step 106) is greater than about 20 microseconds.

None of the embodiments of the present disclosure are intended to limit the scope of any other embodiment of the present disclosure. Any or all of any embodiment of the present disclosure may be combined with any or all of any other embodiment of the present disclosure to create new embodiments of the present disclosure.

Those skilled in the art will recognize improvements and modifications to the embodiments of the present disclosure. All such improvements and modifications are considered within the scope of the concepts disclosed herein and the claims that follow.

What is claimed is:

1. A method comprising:
   providing a substrate;
   forming a silicon carbide epitaxial structure on the substrate, the silicon carbide epitaxial structure having at least three layers, wherein at least one of the at least three layers is a P-type silicon carbide layer and another of the at least three layers is an N-type silicon carbide layer;
   forming an intrinsic silicon carbide layer between the P-type silicon carbide layer and the N-type silicon carbide layer;
   ion implanting a carbon vacancy reduction material into a surface of the silicon carbide epitaxial structure; and
   annealing the silicon carbide epitaxial structure to mobilize the carbon vacancy reduction material to diffuse carbon atoms substantially throughout the silicon carbide epitaxial structure, thereby increasing an average carrier lifetime in the silicon carbide epitaxial structure.

2. The method of claim 1 wherein the carbon vacancy reduction material comprises at least one selected from a group consisting of Group V of a Periodic Table of the Elements.

3. The method of claim 2 wherein the carbon vacancy reduction material comprises nitrogen.

4. The method of claim 2 wherein the carbon vacancy reduction material comprises phosphorus.

5. The method of claim 1 wherein diffusing the carbon atoms substantially throughout the silicon carbide epitaxial structure at least partially fills carbon vacancies in a crystalline lattice of the silicon carbide epitaxial structure.

6. The method of claim 1 further comprising removing at least a portion of the silicon carbide epitaxial structure from the silicon carbide epitaxial structure after annealing the silicon carbide epitaxial structure.

7. The method of claim 6 wherein a carrier concentration of the carbon vacancy reduction material in the silicon carbide epitaxial structure after substantially removing at least a portion of the carbon vacancy reduction material is less than about 10 percent of a carrier concentration of any material in the silicon carbide epitaxial structure.

8. The method of claim 6 wherein a carrier concentration of the carbon vacancy reduction material in the silicon carbide epitaxial structure after substantially removing at least a portion of the carbon vacancy reduction material is less than about one percent of a carrier concentration of any material in the silicon carbide epitaxial structure.

9. The method of claim 1 further comprising substantially removing the carbon vacancy reduction material by removing the surface of the silicon carbide epitaxial structure after annealing the silicon carbide epitaxial structure, such that a thickness of removed material from the silicon carbide epitaxial structure is less than about three micrometers.

10. The method of claim 1 wherein the carbon vacancy reduction material is not subsequently removed from the silicon carbide epitaxial structure.

11. The method of claim 1 wherein the average carrier lifetime in the silicon carbide epitaxial structure after annealing the silicon carbide epitaxial structure is at least ten times an average carrier lifetime in the silicon carbide epitaxial structure without the carbon vacancy reduction material, wherein the average carrier lifetime in the silicon carbide epitaxial structure without the carbon vacancy reduction material is about three microseconds.

12. The method of claim 1 wherein the carbon vacancy reduction material comprises at least one selected from a group consisting of Group III and Group VIII of a Periodic Table of the Elements.

13. The method of claim 1 wherein the carbon vacancy reduction material comprises hydrogen.

14. The method of claim 1 wherein during the annealing of the silicon carbide epitaxial structure, a temperature of the silicon carbide epitaxial structure is between about 1650 and about 1800 degrees Celsius.

15. The method of claim 1 wherein during the annealing of the silicon carbide epitaxial structure, a temperature of the silicon carbide epitaxial structure is between about 1650 and about 1800 degrees Celsius for a duration of greater than twenty minutes.

16. The method of claim 1 wherein during the annealing of the silicon carbide epitaxial structure, a temperature of the silicon carbide epitaxial structure is between about 1500 and about 1600 degrees Celsius.

17. The method of claim 1 wherein the carbon vacancy reduction material does not comprise carbon.

18. A semiconductor die comprising:
a substrate; and
a silicon carbide epitaxial structure on the substrate comprising:
- at least three layers, wherein at least one of the at least three layers is a P-type silicon carbide layer and another of the at least three layers is an N-type silicon carbide layer;
- an intrinsic silicon carbide layer between the P-type silicon carbide layer and the N-type silicon carbide layer; and
- carbon vacancy reduction material, which has been implanted into a surface of the silicon carbide epitaxial structure, wherein the silicon carbide epitaxial structure has been annealed to mobilize the carbon vacancy reduction material to diffuse carbon atoms substantially throughout the silicon carbide epitaxial structure, thereby increasing an average carrier lifetime in the silicon carbide epitaxial structure.

19. The semiconductor die of claim 18 wherein a structure thickness of the silicon carbide epitaxial structure is equal to at least 100 micrometers.

20. The semiconductor die of claim 18 wherein a structure thickness of the silicon carbide epitaxial structure is equal to at least 150 micrometers.

21. The semiconductor die of claim 18 wherein a structure thickness of the silicon carbide epitaxial structure is equal to at least 200 micrometers.

22. The semiconductor die of claim 18 wherein the substrate comprises silicon carbide.

23. The method of claim 1 wherein the N-type silicon carbide layer is on the substrate.

24. The method of claim 23 wherein the P-type silicon carbide layer is on the intrinsic silicon carbide layer.

25. The method of claim 1 wherein the P-type silicon carbide layer is on the substrate.

26. The method of claim 25 wherein a first N-type silicon carbide layer is on the intrinsic silicon carbide layer.

27. The semiconductor die of claim 18 wherein the carbon vacancy reduction material does not comprise carbon.

28. The method of claim 1 wherein during the annealing of the silicon carbide epitaxial structure, a temperature of the silicon carbide epitaxial structure is between about 1650 and about 1800 degrees Celsius for a duration of between about twenty minutes and about two hours.

29. The method of claim 1 wherein during the annealing of the silicon carbide epitaxial structure, a temperature of the silicon carbide epitaxial structure is between about 1650 and about 1800 degrees Celsius for a duration of between about twenty minutes and about ten hours.

30. A method comprising:
providing a substrate;
forming a silicon carbide epitaxial structure on the substrate, the silicon carbide epitaxial structure having at least three layers, wherein at least one of the three layers is an N-type silicon carbide layer and another of the three layers is a P-type silicon carbide layer;
forming an intrinsic silicon carbide layer between the P-type silicon carbide layer and the N-type silicon carbide layer ;
ion implanting a carbon vacancy reduction material into a surface of the silicon carbide epitaxial structure; and
annealing the silicon carbide epitaxial structure to mobilize the carbon vacancy reduction material to diffuse carbon atoms substantially throughout the silicon carbide epitaxial structure, thereby increasing an average carrier lifetime in the silicon carbide epitaxial structure.

31. A semiconductor die comprising:
a substrate; and
a silicon carbide epitaxial structure on the substrate comprising:
- at least three layers, wherein at least one of the three layers is a N-type silicon carbide layer and another of the three layers is a P-type silicon carbide layer;
- an intrinsic silicon carbide layer between the P-type silicon carbide layer and the N-type silicon carbide layer; and
- carbon vacancy reduction material, which has been implanted into a surface of the silicon carbide epitaxial structure, wherein the silicon carbide epitaxial structure has been annealed to mobilize the carbon vacancy reduction material to diffuse carbon atoms substantially throughout the silicon carbide epitaxial structure, thereby increasing an average carrier lifetime in the silicon carbide epitaxial structure.

* * * * *